(12) United States Patent
Gross (10) Patent No.: US 9,103,896 B2
(45) Date of Patent: Aug. 11, 2015

(54) METHOD AND DEVICE FOR ESTABLISHING EXCITATION PARAMETERS FOR MR IMAGING

(75) Inventor: Patrick Gross, Langensendelbach (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 592 days.

(21) Appl. No.: 13/406,554

(22) Filed: Feb. 28, 2012

(65) Prior Publication Data
US 2012/0223707 A1 Sep. 6, 2012

(30) Foreign Application Priority Data

Mar. 1, 2011 (DE) .......................... 10 2011 004 881
Jul. 8, 2011 (DE) .......................... 10 2011 078 849

(51) Int. Cl.
G01R 33/561 (2006.01)
(52) U.S. Cl.
CPC .................................. G01R 33/5612 (2013.01)
(58) Field of Classification Search
CPC .................................................. G01R 33/5612
See application file for complete search history.

(56) References Cited

U.S. PATENT DOCUMENTS

| | | | |
|---|---|---|---|
| 6,865,494 B2 * | 3/2005 | Duensing et al. ............... | 702/38 |
| 7,336,145 B1 | 2/2008 | Adalsteinsson | |
| 7,394,251 B2 * | 7/2008 | Lin ............................... | 324/309 |
| 7,423,430 B1 * | 9/2008 | Sharif et al. .................. | 324/309 |
| 7,570,054 B1 * | 8/2009 | Lin ............................... | 324/309 |
| 7,592,807 B2 * | 9/2009 | Pineda et al. ................. | 324/307 |
| 7,777,486 B2 * | 8/2010 | Hargreaves et al. .......... | 324/309 |
| 8,502,535 B2 * | 8/2013 | Jurrissen et al. ............. | 324/309 |
| 8,581,589 B2 * | 11/2013 | Wald et al. .................... | 324/322 |
| 8,638,096 B2 * | 1/2014 | Zhang et al. .................. | 324/309 |
| 8,710,840 B2 * | 4/2014 | Gross et al. ................... | 324/309 |

FOREIGN PATENT DOCUMENTS

| | | |
|---|---|---|
| CN | 1864080 A | 11/2006 |
| DE | 102008015054 B3 | 1/2010 |
| DE | 102008061455 A1 | 6/2010 |
| DE | 102009016341 A1 | 10/2010 |
| EP | 0889330 A1 | 1/1999 |

OTHER PUBLICATIONS

Xiaoming Yin, Andrew C. Larson: "k-TE generalized autocalibrating partially parallel acquisition (GRAPPA) for accelerated multiple gradient-recalled echo (MGRE)R2* mapping in the abdomen". in: Magn.Reson.in Medicine, vol. 61, Issue 3, Mar. 2009, pp. 507-516.; Magazine; 2009.

(Continued)

Primary Examiner — Dixomara Vargas (57) ABSTRACT

A method and a device for establishing excitation parameters, in particular for establishing an excitation profile, for MR imaging, are proposed. Elements of a k-space covariance matrix are determined for signal noise in k-space data which is captured using a plurality of receive channels in the context of data captured at an examination object. Elements of at least one image space covariance matrix are mathematically determined for a plurality of voxels of the examination object as a function of the k-space covariance matrix. The excitation parameters are established as a function of the determined elements of the at least one image space covariance matrix.

18 Claims, 5 Drawing Sheets

(56) References Cited

OTHER PUBLICATIONS

Siemens, "Parallel transmit Technology for High Field MRI", Magnetom Flash—The Magazine of MR, Issue No. 1/2009, ISMRM Edition, Siemens; Others; 2009; pp. 1-5, 124-135.

Andrew G. Webb et al: "Parallel Transmit and Receive Technology in High-Field Magnetic Resonance Neuroimaging", 2010 Wiley Periodicals, Inc., Received Sep. 30, 2009; accepted Dec. 4, 2009.; Others; 2009; pp. 2-13.

D. Mitsouras et al.: Strategies for inner volume 3D fast spin echo magnetic resonance imaging using nonselective refocusing radio frequency pulses. In: Med. Phys., 33, 2006, S. 173-186.; Others; 2006.

Y. Ding et al: "Accurate noise level' and noise covariance matrix assessment in phased array coil without a noise scan", In: Proc. Int. Soc. Magn. Reson. Med.,2010, Nr. 648.; Others; 2010.

Lin, Fa-Hsuan et al., Parallel MRI Reconstruction Using Variance Partitioning Regularization, Magnetic Resonance in Medicine, 58, 2007, pp. 735-744; Others.

MacKay, "Information Theory, Inference, and Learning Algorithms" 6. Aufl. Cambridge University Press, Cambridge, 2003 Seite 188; 2003.

Pruessmann et al. "SENSE: Sensitivity Encoding for Fast MRI", Mag. Res. Med. 42:952-962 (1999).

Kellman, "Parallel Imaging: The Basics", Laboratory of Cardiac Energetics, NHLBI, National Institutes of Health, DHHS, Bethesda, MD, USA 20892, 2004.

* cited by examiner

METHOD AND DEVICE FOR ESTABLISHING EXCITATION PARAMETERS FOR MR IMAGING

CROSS REFERENCE TO RELATED APPLICATIONS

This application claims priority of German application No. 10 2011 004 881.2 filed Mar. 1, 2011 and German application No. 10 2011 078 849.2 filed Jul. 8, 2011. Both of the applications are incorporated by reference herein in their entirety.

FIELD OF INVENTION

The invention relates to a method and a device for establishing excitation parameters for MR imaging. The invention relates in particular to a method and a device for MR data capture, which allows spatially varying excitation profiles to be generated using a plurality of transmit channels.

BACKGROUND OF INVENTION

MR imaging is widely used today as it allows the recording of two-dimensional or three-dimensional image data which can portray the structures in the interior of an examination object with high resolution. During the MR imaging, the nuclear spins of hydrogen nuclei in the examination object are aligned in a main magnetic field ($B_0$) and then excited as a result of irradiation by HF (high-frequency) pulses. The excited magnetization is detected, wherein spatial encoding can be achieved using various known methods.

The time that is required for data capture can be reduced by means of parallel data capture using a plurality of receive coils. However, such a data capture can cause a degradation of the signal/noise ratio. For example, it is not possible to separate signal components of different voxels in the k-space data that is captured by a plurality of receive channels. The resulting degradation of the signal/noise ratio is frequently quantified by a location-dependent geometry factor (g factor).

In addition to parallel data capture using a plurality of receive coils, parallel excitation ("parallel transmit") using a plurality of transmit channels is also possible in MR imaging. The plurality of transmit channels can be a plurality of transmit coils, each of which can be so controlled (in a monitored manner) that a desired locally varying excitation profile is produced. The parallel excitation and parallel data recording can be performed using the same coils or coil segments that are coupled respectively via a transmit/receive filter to both a transmit path for excitation and a receive path for the data recording.

Examples of MR imaging which uses a plurality of transmit channels for excitation and a plurality of receive channels for data recording are described in Lawrence L. Wald, Elfar Adalsteinsson: "Parallel Transmit Technology for High Field MRI", MAGNETOM Flash 1/2009, pages 124-135 (2009), Siemens AG, Erlangen, Germany and in Andrew G. Web, Christopher M. Collins, "Parallel Transmit and Receive Technology in High Field Magnetic Resonance Neuroimaging", International Journal of Imaging Systems and Technology—Special Issue on Neuroimaging, Vol. 20, 2-13 (2010), Wiley, New York, USA.

The parallel excitation, for generating an excitation profile that can be modified in more than one dimension, can be used for the purpose of at least partially reducing the degradation of the signal/noise ratio that occurs when data capture is effected using a plurality of receive channels. By limiting the excitation to the "region of interest" (RoI) of the examination object, for example, it would be possible to reduce signal degradation caused by correlated noise of voxels outside of the RoI. In order to achieve such a localization of the excitation, it can however be necessary to use long excitation pulses and/or a high excitation power. This is undesirable.

SUMMARY OF INVENTION

The invention addresses the problem of providing a method and a device by means of which excitation parameters, in particular an excitation profile, can be determined for MR imaging in such a way that the signal/noise ratio for voxels of the RoI can be improved. In particular, the invention addresses the problem of specifying such a method and device whereby complete suppression of the excitation signal outside of the RoI is not required.

Specified are a method, a device, an MR installation and a computer program having the features defined in the independent claims. The dependent claims define exemplary embodiments.

According to a first aspect of the invention, a method is specified for establishing excitation parameters for MR imaging, wherein said method involves parallel excitation using a plurality of transmit channels and parallel data capture using a plurality of receive channels. According to the method, elements of a k-space covariance matrix are determined for signal noise in k-space data which is captured in the context of data capture at an examination object using the plurality of receive channels. Elements of at least one image space covariance matrix are mathematically determined for a plurality of voxels of the examination object as a function of the k-space covariance matrix. The excitation parameters are established as a function of the determined elements of the at least one image space covariance matrix.

The excitation parameters that are determined can correspond to or influence an excitation profile. The elements of the image space covariance matrix that are determined can be diagonal elements or extra-diagonal elements of the image space covariance matrix for voxels in the RoI. It is also possible to determine all elements of the image space covariance matrix.

According to the method, excitation parameters which represent or influence an excitation profile for the MR imaging are systematically specified as a function of a covariance between voxels of the examination object. Excitation parameters can therefore be selected such that the local geometry factor for voxels in an RoI is reduced.

The method takes into consideration that a difference between voxels can occur in the case of parallel data capture due to the different receive coils and their respective location-dependent sensitivity. Allowance is made for this possibility by the covariance matrix (in the k-space or the location space), which is characteristic of the respective coil arrangement and the currently examined section of the examination object. The selection of an excitation profile as a function of the image space covariance matrix takes into consideration that the signal of all points outside of the RoI does not have to be suppressed for the respective coil arrangement, and allows the systematic identification of a suitable excitation profile.

According to the method, the k-space covariance matrix can be determined on the basis of data that is obtained in the course of data capture, during which use is made of an excitation profile that is homogeneous in the sense that it does not significantly vary within an excited layer. A homogeneous excitation profile, in which relative fluctuations of the amplitude in a layer are smaller than a threshold value, can be used to determine the k-space covariance matrix.

The excitation parameters can represent or influence information which is known prior to the MR data capture, and on which the image space covariance matrix depends. The excitation parameters can be determined such that the elements of the image space covariance matrix satisfy a predefined condition.

The information that is known prior to the MR data capture is also referred to here as prior information, since it is known beforehand. If the excitation parameters represent or establish a locally variable excitation profile, at any rate zeroes of the locally variable signal amplitude are prior information. For example, it is known beforehand that voxels in which no excitation occurs do not contribute a signal component. In this way, the influence of the excitation parameters on the image space covariance matrix can be systematically taken into consideration.

The elements of the image space covariance matrix that have been determined can include at least diagonal elements of the image space covariance matrix, which correspond to voxels from the RoI. The elements of the image space covariance matrix that have been determined can alternatively or additionally include extra-diagonal elements of the image space covariance matrix, which specify the covariances between a voxel in the RoI and voxels outside of the RoI.

In order to establish the excitation parameters, covariances of the prior information can be determined in such a way that geometry factors for voxels in an RoI of the examination object satisfy a predefined condition. In this way, covariances of the prior information can initially be determined in a systematic manner, such that the image space covariance matrix satisfies a desired condition. From the covariances of the prior information, it is then possible to draw conclusions about an excitation profile to be used.

In order to establish the excitation parameters, a covariance matrix of the prior information can be specified, for which the elements of the image space covariance matrix satisfy the predefined condition. The specification of the covariance matrix of the prior information can comprise a solution of the equation $$C_0^{-1} = (E^\dagger C^{-1} E)^{-\frac{1}{2}} D_\rho^{-1} (E^\dagger C^{-1} E)^{-\frac{1}{2}} - I, \quad (1)$$

where $C_0$ designates the covariance matrix of the prior information, E designates the encoding matrix, C designates the k-space covariance matrix, $D_\rho$ designates an image space covariance matrix whose elements satisfy the predefined condition, and I designates a unit matrix. This allows a systematic determination of the matrix $C_0$. The matrix $C_0$ can be used to identify a suitable excitation profile. In particular, mathematical determination of $C_0$ can systematically determine those voxels at which an excitation must be suppressed in order to suppress noise in the resulting image data for the RoI, taking into consideration the spatial selectivity of the receive coils. It is also possible to determine those voxels in which no suppression of the signal amplitude is required. The requirements in relation to the excitation profile are therefore reduced.

The covariances of the prior information can be specified in an iterative method. Therefore the excitation parameters can be specified in a systematic method.

The covariances of the prior information can be mathematically specified automatically subject to constraints. It can therefore be taken into consideration that even using a plurality of excitation coils, it is not possible to realize any desired covariance matrix of signal amplitudes. For example, it is typically possible to suppress diagonal elements of such a covariance matrix of the prior information, whereas direct control of the extra-diagonal elements is difficult or impossible.

According to the method, those elements of the image space covariance matrix which are assigned to the corresponding set of excitation parameters can be determined mathematically for a plurality of sets of excitation parameters. The excitation parameters for the MR imaging can be established as a function of those elements of the image space covariance matrix which were determined in each case for the plurality of sets of excitation parameters. For example, an evaluation function can be defined that is specified as a function of the determined elements of the image space covariance matrix. That set of excitation parameters for which the evaluation function is extremal can be established for the subsequent MR imaging. The evaluation can take place subject to the constraint that the amplitude of the excitation profile in the RoI is not suppressed.

The plurality of sets of excitation parameters can correspond to a plurality of excitation profiles. For example, the excitation profiles can be sinusoidally or cosinusoidally modulated as a function of the location. The tested excitation profiles can be selected subject to additional conditions. For example, it is possible to select for evaluation only those excitation profiles which have no zeroes in the RoI. Alternatively or additionally, it is possible to evaluate excitation profiles which have a maximum in the RoI.

According to the method, extra-diagonal elements of the at least one image space covariance matrix can be determined, and voxels of the examination object whose correlation with voxels in an RoI of the examination object exceeds a threshold value can be specified therefrom. It is thus possible in a heuristic manner to determine directly from the image space covariance matrix which voxels are to be suppressed.

The excitation parameters can be so determined as to minimize an evaluation function that is dependent on diagonal elements of the image space covariance matrix, which correspond to voxels in an RoI of the examination object. For example, the variable $$Tr(RC_\rho R^\dagger) \quad (2)$$

can be analyzed and minimized for a plurality of excitation profiles, wherein Tr designates the trace operator, $C_\rho$ designates the image space covariance matrix for the relevant excitation profile, and R designates a projection operator for the RoI. The variable represents the sum of the standard deviations of the signals for voxels in the RoI. By minimizing this variable, an excitation profile is determined for which the signal noise in the RoI is reduced in comparison with a homogeneous excitation profile.

The determined elements of the k-space covariance matrix can comprise covariances of k-space data that was captured using different recording coils. In this way, correlations between k-space data that was captured using different recording coils are taken into consideration during the specification of an excitation profile.

Using the method, an excitation profile for MR imaging can be determined for measuring variables that are dependent on echo time, in particular for a multi-echo imaging sequence. In such applications, spatial variations of the flip angle for the spins within the RoI are less critical than in other applications, which require an essentially constant flip angle in the RoI in order to avoid excessive variations in contrast. Consequently, there is greater freedom in the selection of an excitation profile in the case of applications for determining echo time-dependent variables, e.g. $T_2^*$ measurements. This simplifies the choice of an excitation profile in order to reduce noise in image space data for the RoI.

The excitation parameters can be determined in such a way that different portions of the captured MR image are suppressed for different echo times.

According to a further aspect, a device is specified for establishing excitation parameters for MR imaging, wherein parallel excitation is effected by means of a plurality of transmit channels and parallel data capture is effected by means of a plurality of receive channels. The device comprises an interface for receiving k-space data that has been captured using a plurality of receive channels during data capture at an examination object, and an electronic computing facility. The electronic computing facility is configured to determine elements of a k-space covariance matrix for signal noise in the k-space data that is captured using a plurality of receive channels. The computing facility is further configured to mathematically determine elements of at least one image space covariance matrix for a plurality of voxels of the examination object as a function of the k-space covariance matrix. The computing facility is further configured to automatically establish the excitation parameters as a function of the determined elements of the at least one image space covariance matrix.

Using such a device, taking correlations in the reconstructed image data into consideration, it is possible systematically to determine an excitation profile by means of which signal noise in image data for the RoI is reduced. The excitation profile can be optimized subject to the constraint that no significant suppression of the excitation is to occur in the RoI.

The device can be configured to perform the method in accordance with an aspect or exemplary embodiment.

According to a further aspect, a magnetic resonance installation for MR imaging is specified. The magnetic resonance installation comprises an excitation facility which has a plurality of transmit channels and is configured for the controllable generation of a spatially variable excitation profile. The magnetic resonance installation further comprises a receive entity which has a plurality of receive channels for MR data capture following an excitation. The magnetic resonance installation also comprises a device that is coupled to the excitation facility in accordance with an exemplary embodiment, in order to establish an excitation profile and to control the excitation facility correspondingly.

The excitation facility can comprise a plurality of separate coils or segments of a coil array. The receive entity can comprise a plurality of separate coils or segments of a coil array. The coils or the coil array can be used by both the excitation facility and the receive facility, wherein corresponding transmit/receive filters are provided.

According to a further aspect, a computer program is specified which can be loaded directly into a memory of a programmable device of a magnetic resonance installation, wherein the computer program comprises a sequence of control instructions which, when executed by the device of the magnetic resonance installation, cause the device to perform the method in accordance with an aspect or exemplary embodiment. The computer program can be stored on a non-transient data storage medium.

Methods and devices according to exemplary embodiments can be used in particular for MR imaging in which a uniform flip angle of the spin in the RoI is not absolutely essential, e.g. for creating a $T_2^*$ chart. The exemplary embodiments are not restricted to this application.

BRIEF DESCRIPTION OF THE DRAWINGS

Exemplary embodiments of the invention are described in greater detail below with reference to the drawing.

DETAILED DESCRIPTION OF INVENTION

While for the purpose of explanation the following description refers in some cases to specific MR imaging sequences, e.g. for determining $T_2^*$ times, sequences other than those cited can also be used.

Figure 1:
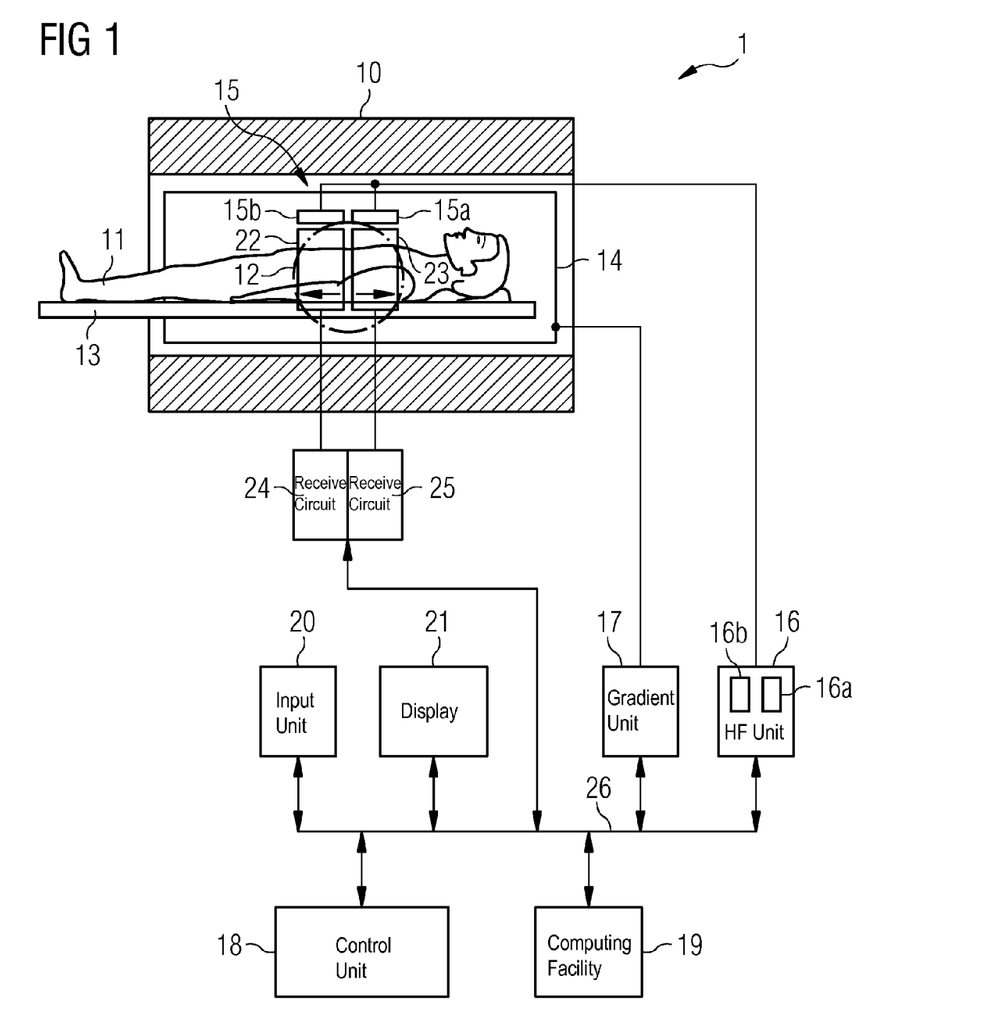
FIG. 1 is a schematic illustration of an MR installation comprising a device for establishing an excitation profile.

FIG. 1 schematically shows a magnetic resonance (MR) installation 1. The MR installation 1 has a magnet 10 for generating a polarization field B0. An examination object 11 can be moved on a patient couch 13 relative to the magnet 10. The MR installation 1 has a gradient system 14 for generating magnetic field gradients which are used for the imaging and spatial encoding. A gradient unit 17 is provided for controlling the gradient system 14.

For the purpose of exciting the magnetic polarization that is generated in the B0 field, provision is made for a high-frequency (HF) coil arrangement 15, comprising a plurality of excitation coils 15a and 15b which can generate a high-frequency field. The excitation coils 15a and 15b do not have to be separate coils. They could alternatively be designed as segments of a coil array, for example. An HF unit 16 is provided for the purpose of activating the HF coil arrangement. The HF unit 16 is configured that the HF coil arrangement 15 can be controlled in such a way that different excitation profiles can be generated selectively. For this purpose, the HF unit can have a plurality of control paths 16a, 16b, each of which is assigned to one of the excitation coils 15a, 15b. While excitation coils 15a and 15b are axially offset for the sake of clarity in the illustration according to FIG. 1, the plurality of excitation coils of the HF coil arrangement can also be arranged differently. In particular, the various excitation coils or segments of a coil array of the HF coil arrangement can be arranged peripherally around a cylinder surface, in order to realize different excitation profiles within a layer of the examination object. Possible arrangements that can be used in the context of exemplary embodiments are described in Lawrence L. Wald, Elfar Adalsteinsson: "Parallel Transmit Technology for High Field MRI", MAGNETOM Flash 1/2009, pages 124-135 (2009), Siemens AG, Erlangen, Germany and the documents cited therein.

The recording of MR signals from the examination region 12 can be done by means of a coil arrangement. The MR installation 1 comprises a plurality of receive coils 22, 23 for capturing MR signals, and corresponding receive circuits 24, 25. The receive coils can be respectively local receive coils or component coils. These can be part of a larger coil array (e.g. phased array coils), which can comprise further receive coils.

While separate excitation coils 15a, 15b and receive coils 22, 23 are illustrated in FIG. 1 for clarification, the same coils and/or segments of a component coil can be used both for excitation and for data capture. For example, both the receive circuit 24 and the control path 16b can be coupled via a transmit/receive filter to the coil 22 in this case. For the excitation, the corresponding coil is controlled by the assigned control path of the HF unit 16 such that a desired excitation occurs. For the data capture, the signal captured by the coil is routed via the transmit/receive filter to corresponding receive circuit, where it is processed further.

The MR installation 1 is controlled centrally by a control unit 18. The control unit 18 controls the irradiation of HF pulses and the recording of resulting MR signals. A reconstruction of image data from the MR raw data and further processing of the image data takes place in a computing facility 19. The raw data can be provided to the computing facility 19 via a suitable interface 26, e.g. a bus. While the control unit 18 and the computing facility 19 in FIG. 1 are schematically illustrated as separate elements, a single computer can satisfy both functions. Using an input unit 20, an operator can select various protocols for the data capture, and enter or modify parameters, which are displayed on a display 21. For example, the operator can select a region of interest (RoI) of the examination object, for which a signal noise is to be reduced.

The control unit 18 and the computing facility 19 are configured such that, during an MR data capture, an excitation profile is established which is generated by the excitation coils 15a, 15b. The excitation profile can be selected such that excitation of the nuclear spin is effected in a spatially selective manner within a layer of the examination object. As described below in greater detail, the excitation profile is systematically established such that a signal/noise ratio for voxels in the RoI is reduced in comparison with a homogeneous excitation. The selection of the excitation profile can be done in such a way that the reduction of the noise for voxels in the RoI is not accompanied by a reduction of the signal for these voxels. The establishment of the excitation profile is systematically effected as a function of a noise covariance matrix, which represents covariances of signal noise in the k-space in the signals that were captured by the plurality of receive coils 22, 23 during a first MR data capture. It is thus possible, when establishing the excitation profile, to systematically take into consideration that the different spatial selectivity of the receive coils allows signals from different voxels to be distinguished in a certain area. It is therefore not necessary, during parallel data capture, for the excitation signal to be completely suppressed everywhere outside of the RoI in order to obtain image data having reduced noise in the RoI.

As described below in greater detail, constraints that are imposed by the plurality of excitation coils 15a, 15b can be taken into consideration for the purpose of determining the excitation profile as a function of the k-space covariance matrix.

The first MR data capture, which can be done using a homogeneous excitation and is used for determining the k-space covariance matrix, can be performed in such a way that the resulting data has a lower resolution than the subsequent MR data capture using the excitation profile. In this way, the mathematical effort involved in determining the excitation profile remains modest. In this case, the MR data capture using homogeneous excitation can also be performed in a shorter time than the subsequent higher-resolution MR data capture.

The control unit 18 is so configured such that the MR installation for performing the MR data capture is controlled as a function of an excitation profile that has been determined by the computing facility 19. To this end, the HF unit 16 is controlled such that the excitation coils 15a, 15b generate the desired excitation profile. The MR data capture can take place using a multiplicity of different sequences in this case. For example, the control unit 18 can control the installation in accordance with a turbo-spin echo or MGRE sequence. The echo sequence can be part of an EPI sequence, in which all k-space lines are sampled within a repetition time, i.e. in which a compete image data record is recorded following an excitation. It is also possible to use segmented EPI sequences, by means of which part of the k-space is sampled using an echo train. An EPI sequence can be based on a gradient echo or spin echo. An equivalent echo time can be assigned to the resulting image data. In particular, the control can be effected in such a way that a multi-echo sequence (e.g. MGRE) is performed, wherein a sequence of gradient echoes is generated by means of repeated switching of gradients. Using an echo train, a k-space line can be sampled in each case, wherein each echo corresponds to a different echo time. On the basis of the echo trains for the k-space lines that are to be sampled, it is then possible to reconstruct an image data record for each echo time and each receive coil 22, 23.

The MR installation 1 can be configured to perform accelerated imaging, e.g. a partial parallel imaging method such as SENSE, GRAPPA or SMASH (ppa=partial parallel acquisition). In this case, control unit 18 can be configured in such a way that, as a result of omitting k-space lines, only incomplete sampling of the k-space is performed, wherein the recording of MR signals nonetheless takes place simultaneously using the receive coils 22 and 23 and possibly other coils. A reconstruction of the missing data can then take place in the k-space or in the image space according to the method. The control unit 18 can be so configured as to perform the k-TE GRAPPA method described in "k-TE Generalized Autocalibrating Partially Parallel Acquisition (GRAPPA) for Accelerated Multiple Gradient-Recalled Echo (MGRE)R2* Mapping in the Abdomen", Xiaoming Yin et al., Magnetic Resonance in Medicine 61:507-516 (2009). k-TE-GRAPPA uses an MGRE recording sequence in which the peripheral regions of the k-spaces are only partially sampled. Omitted k-space lines are reconstructed using not only adjacent k-space lines (recorded by means of adjacent receive coils of a coil array), but also using k-space lines for adjacent echo times. This results in complete image data records for the various echo times and for each of the receive coils that is used.

The image reconstruction of the image data can be performed for the respective recording sequence by the computing facility 19 using conventional reconstruction methods. By establishing the excitation profile as a function of the k-space covariance matrix in k-space signals for the first MR data capture, the resulting image data in the RoI has an improved signal/noise ratio.

The operation of the computing facility 19 during the establishment the excitation profile is described in greater detail below with reference to FIGS. 2-6.

Figure 2:
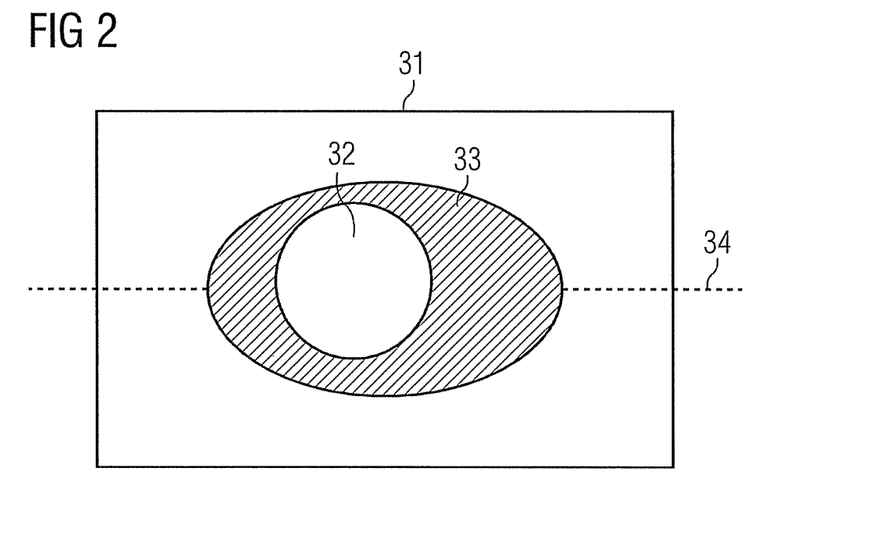
FIG. 2 is a schematic illustration of image data.

FIG. 2 is a schematic illustration of image data 31, which represents a layer of the examination object. In numerous applications, only a specific image region, the RoI 32, is of interest for the imaging. In particular, a poor signal/noise ratio outside of the RoI 32 can be tolerated, while the best possible signal/noise ratio should be achieved for the RoI 32.

The noise for voxels in the RoI. 32 could be reduced if excitation of spins took place only within the RoI 32 during the MR data capture. For an existing arrangement comprising a plurality of excitation coils, however, this is often not possible, or is only possible using long pulse durations and/or high pulse intensity, these being undesirable for various reasons.

Using devices and methods according to exemplary embodiments, those voxels 33 which should be suppressed in order to obtain a better signal/noise ratio in the RoI are identified as a function of covariances of the signal noise as captured during a first MR data capture. The signal suppression for the voxels 33 can be done by means of suppressing the excitation profile for the voxels 33. The excitation profile can be suppressed selectively for voxels outside of the ROI 32, in order to avoid weakening the signal for voxels of the RoI 32.

Figure 3:
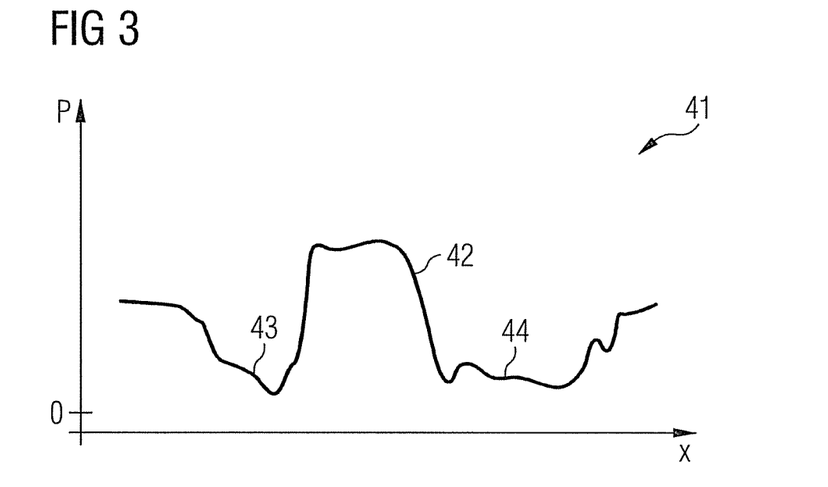
FIG. 3 is a schematic illustration of an excitation profile that has been determined.

FIG. 3 is a schematic illustration of an exemplary excitation profile 41, which is established using devices and methods according to exemplary embodiments. In this case, the amplitude of the HF excitation pulse is illustrated as a function of the location along a line 34 of the image data in FIG. 2.

In a region which corresponds to the RoI 32, the excitation profile has a relatively high amplitude 42. The excitation of the voxels corresponding to the RoI 32 can be selected so as to be as high as possible. Depending on the application, the excitation profile can be selected such that the relative or absolute fluctuation of the amplitude in the RoI is less than a threshold value. Depending on the application, however, this is not essential. For example, greater fluctuations in the amplitude of the excitation profile can also be tolerated within the RoI when measuring echo time-dependent variables.

The excitation profile is selected such that the amplitude is suppressed in regions 43, 44, corresponding to voxels that are situated outside of the RoI and significantly increase the signal noise for image data in the RoI. The amplitude of the excitation profile in the regions 43, 44 is selected such that it can be significantly lower than the amplitude of the excitation profile in the RoI.

Using methods and devices, the influence of various excitation profiles on a signal noise of the image data in the RoI can be mathematically determined in advance. A quantitative evaluation of different excitation profiles can be carried out. In this way, it is possible to determine an excitation profile for which the signal/noise ratio of the voxels in the RoI is greater than a predefined threshold value. Alternatively, an excitation profile can be determined from a predefined class of possible excitation profiles, for which excitation profile the noise of the image data in the RoI is minimized subject to the constraint that the signal for voxels in the RoI is not reduced.

As a result of mathematically determining the influence of different excitation profiles on the noise in the RoI in the image data, it is also possible to determine those voxels which have only a minor influence on the noise in voxels of the RoI in the image data. It is therefore possible to determine voxels which influence only slightly the signal noise in the RoI in the image data. The knowledge of these voxels provides greater freedom in the choice of a suitable excitation profile. In particular, it is possible to select excitation profiles which, at those voxels that are only weakly correlated with voxels in the RoI, have an amplitude that does not necessarily have to be suppressed and can even be comparable with the amplitude for voxels in the RoI. The requirements in respect of possible excitation profiles are therefore relaxed in comparison with a stepped function.

Various methods for establishing an excitation profile whereby the signal/noise ratio for voxels of the RoI can be improved are described in greater detail below. Using such methods, the local geometry factor in the RoI can therefore be reduced. The methods can be performed by the computing facility 19 of the MR installation 1.

The covariance matrix of image data can be generally expressed as $$C_\rho = \langle (\vec{\rho} - \langle\vec{\rho}\rangle)(\vec{\rho} - \langle\vec{\rho}\rangle)^\dagger \rangle \qquad (3)$$
$$= (E^\dagger C^{-1} E)^{-\frac{1}{2}} (C_0^{-1} + I)^{-1} (E^\dagger C^{-1} E)^{-\frac{1}{2}}.$$

In this case, $C_\rho$ designates the image space covariance matrix, E designates the encoding matrix, C designates the k-space covariance matrix, $C_0$ designates a covariance matrix for previously known information, and I designates a unit matrix. In conventional notation, the dagger sign designates the adjoint of the corresponding matrix, i.e. the transpose of the matrix of complex conjugates.

Using methods and devices according to exemplary embodiments, equation (3), which establishes a relationship between covariances C of k-space data that is captured during a first MR data capture and covariances $C_\rho$ in image data, can be used as a basis for determining the excitation profile for which noise for voxels in the RoI can be reduced. The corresponding excitation profile can be determined in various ways, as described in greater detail with reference to FIGS. 4-6.

If M designates the number of image points, K designates the number of k-space points captured using each of the receive coils, and L designates the number of receive coils, the image space covariance matrix $C_\rho$ is an M×M matrix. The k-space covariance matrix C is an N×N matrix, wherein N=K·L is the total number of k-space points sampled using the L receive coils. The matrix $C_0$ and the matrix I in equation (3) are M×M matrices.

The encoding matrix E is the matrix which maps the amplitude of a signal that is present during the MR data capture in the location space into a vector of k-space data having N elements, which would be captured in the noise-free case. It applies generally that $$\vec{d} = E\vec{\rho} + \vec{n}, \qquad (4)$$

where $\vec{d}$ is a column vector which has N elements and is used to group the captured k-space signals, $\vec{\rho}$ is a column vector which has M elements and represents the amplitude of the spin signal in the location space, and $\vec{n}$ is a column vector which has N elements and represents the signal noise. The encoding matrix E is therefore an N×M matrix, which defines a mapping of the amplitude from the location space into the k-space signals that are captured using the plurality of receive coils. The encoding matrix E can take different forms, depending on the pulse sequence and sampling that are used. For example, $$\vec{E} = \begin{pmatrix} S\ FFT[B_1^-]_{Coil\ 1} \\ \vdots \\ S\ FFT[B_1^-]_{Coil\ l} \\ \vdots \\ S\ FFT[B_1^-]_{Coil\ L} \end{pmatrix}, \qquad (5)$$

where S is the so-called selection matrix, which selects only the k-space points that have actually been sampled, FFT is a Fourier transform matrix, which defines the mapping from the location space into the k-space, and $[B_1^-]$ is a matrix which is assigned to the respective coil and whose main diagonal elements are equal to the sensitivity of the corresponding coil at the respective voxel and whose extra-diagonal elements are all equal to 0.

For an encoding matrix having the form specified in equation (5), the column vector of captured k-space data can be expressed as $$\vec{d} = \begin{pmatrix} \vec{d}_{Coil\ 1} \\ \vec{d}_{Coil\ 2} \\ \vdots \\ \vec{d}_{Coil\ L} \end{pmatrix}, \tag{6}$$

wherein the vector $\vec{d}_{Coil\ 1}$ comprising K elements is used in each case to group the k-space data which is sampled by the 1-th coil.

The matrix C in equation (3) represents the covariance matrix for signal noise in the k-space. The matrix can be estimated from the k-space data that is obtained during a first MR data capture, in particular during a data capture using homogeneous excitation.

Assuming that the noise $\vec{n}$ in equation (4) is Gaussian white noise, the probability distribution for measured k-space data can be expressed as $$P(\vec{d}\mid \vec{\rho}, \{w\}, C) = (2\pi)^{-N}|C|^{-1}\exp\left(-\frac{1}{2}(\vec{d}-E\vec{\rho})^\dagger C^{-1}(\vec{d}-E\vec{\rho})\right). \tag{7}$$

In this case, $\{w\}$ designates further parameters on which the probability distribution can conditionally depend. Using methods and devices according to exemplary embodiments, the correlation matrix C of the noise in the k-space can be determined e.g. from the k-space signals that are obtained for a data capture using homogeneous excitation.

For the purpose of simplification, a coordinate transformation is introduced such that $$\vec{A} = T\vec{\rho} \text{ and} \tag{8}$$

$$E = HT \tag{9}$$

where $$T = (E^\dagger C^{-1} E)^{\frac{1}{2}} \text{ and} \tag{10}$$

$$H = E(E^\dagger C^{-1} E)^{-\frac{1}{2}}. \tag{11}$$

A corresponding transformation can be defined for each of a plurality of echo times in the case of imaging sequences in which a plurality of echo signals are captured.

The transformation defined in equations (8)-(11) defines a mapping such that $$H^\dagger C^{-1} H = I. \tag{12}$$

Using equations (8) and (12), the probability distribution according to equation (7) can be expressed as $$P(\vec{d}\mid \vec{A}, \{w\}, C) = (2\pi)^{-N}|C|^{-1}\exp\left(-\frac{1}{2}(\vec{d}-H\vec{A})^\dagger C^{-1}(\vec{d}-H\vec{A})\right), \tag{13}$$

where the probability distribution is conditionally dependent on the vector $\vec{A}$. On the basis of the transformation according to equations (8)-(12), the exponent in equation (13) can be expressed as $$-\frac{1}{2}(\vec{d}-H\vec{A})^\dagger C^{-1}(\vec{d}-H\vec{A}) = \tag{14}$$

$$-\frac{1}{2}\left(\vec{d}^\dagger C^{-1}\vec{d} - \vec{d}^\dagger C^{-1}H\vec{A} - \vec{A}^\dagger H^\dagger C^{-1}\vec{d} + \vec{A}^\dagger \vec{A}\right),$$

where the equation (12) has already been taken into account in the last term of the right-hand side of equation (14).

According to equation (8), the vector $\vec{A}$ represents the spatially resolved signal amplitude that has been transformed using the matrix T. The vector $\vec{A}$ can comprise general complex-valued vector elements.

Using an MR imaging method and a corresponding MR installation which allow spatially resolved excitation, it is possible to force elements of the vector $\vec{\rho}$ to have the value 0 as a result of no excitation occurring at the corresponding voxel. Correspondingly, certain information relating to the vector $\vec{A}$ is known in advance as a result of the selection of the excitation profile. This can be mathematically represented in such a way that a conditional probability distribution for $\vec{A}$ is defined such that $$P(\vec{A}\mid \vec{A}_0, C_0) = (2\pi)^{-M}|C_0|^{-1}\exp\left(-\frac{1}{2}(\vec{A}-\vec{A}_0)^\dagger C_0^{-1}(\vec{A}-\vec{A}_0)\right). \tag{15}$$

In this context, $\vec{A}_0$ designates the most probable value for the vector $\vec{A}$, and $C_0$ designates the covariance matrix for the vector $\vec{A}$ that is defined according to equation (8). $\vec{A}_0$ and $C_0$ are hyperparameters. $\vec{A}_0$ and $C_0$ relate to physical variables by virtue of the transformation defined in equation (8):

$$\vec{A}_0 = T\vec{\rho}_0 \text{ and} \tag{16}$$

$$C_0 = TC_{\rho 0}T^\dagger. \tag{17}$$

In the context of MR imaging in which the excitation profile can be controlled, the covariance matrix $C_0$ for the vector $\vec{A}$ that is defined according to equation (8) depends on the excitation profile. On the basis of the excitation profile, it is possible to establish which voxels do not contribute any signal components. This information that is known in advance (prior information) can be used during the reconstruction. The covariance matrix $C_0$ represents covariances of the prior information.

Using Bayesian statistics, an effective probability distribution which is conditionally dependent on the hyperparameters $\vec{A}_0$ and $C_0$ can be specified for captured k-space data:

$$P(\vec{d}\mid \vec{A}_0, \{w\}, C, C_0) = \int \left(\prod_n dA_n\right) P(\vec{d}\mid \vec{A}, \{w\}, C) P(\vec{A}\mid \vec{A}_0, C_0), \tag{18}$$

where the integral on the right-hand side is executed over the M complex-valued vector elements of the vector $\vec{A}$. In this way, $\vec{A}$ can be integrated out. The probability distributions in equation (18) are given by equations (13) and (15). Multiplication of the probability distributions in equation (18) results in a Gaussian function with an exponent that is bilinear in $\vec{A}$, such that the corresponding integral can be executed.

On the basis of the effective probability distribution of equation (18), the most probable signal amplitude depending on captured k-space data can be expressed as $$\langle \vec{\rho} \rangle = (E^\dagger C^{-1} E)^{-\frac{1}{2}} (C_0^{-1} + I)^{-1} \left( C_0^{-1} \vec{\rho}_0 + (E^\dagger C^{-1} E)^{-\frac{1}{2}} E^\dagger C^{-1} \vec{d} \right). \quad (19)$$

The covariance matrix of the spatially resolved signal amplitude can likewise be determined and produces equation (4).

As described with reference to equation (15), the covariance matrix $C_0$ represents fluctuations of the vector $\vec{A}$, which again depends on the location-dependent signal amplitude as per equation (8). The covariance matrix $C_0$ can be influenced by selection of the excitation profile. By means of selecting a suitable excitation profile as per equation (17), for example, main diagonal elements of $C_0$ can be suppressed in order to reduce signal components of voxels outside of the RoI.

Various systematic approaches can be used to select an excitation profile for MR imaging, depending on the k-space covariance matrix C and the encoding matrix E, in such a way that the noise in the image data is reduced for a desired RoI.

For example, equation (3) can be mathematically resolved so as to produce a reference covariance matrix $D_\rho$ for covariances in the image space having desired properties:

$$C_0^{-1} = (E^\dagger C^{-1} E)^{-\frac{1}{2}} D_\rho^{-1} (E^\dagger C^{-1} E)^{-\frac{1}{2}} - I \quad (4)$$

The reference covariance matrix $D_\rho$ for data in the image space can be selected such that the main diagonal elements for voxels in the RoI are smaller than a threshold value, or that the sum of the main diagonal elements for the voxels in the RoI is smaller than a threshold value.

There is a plurality of reference covariance matrices $D_\rho$ which result in a reduced noise in image data for voxels of the RoI. From among these can be selected those which result in a feasible covariance matrix $C_0$. For example, parallel excitation by means of a plurality of excitation coils can be used to achieve a suppression of main diagonal elements of the matrix $C_0$ or $C_{\rho 0}$. If spatial correlations between voxels are not assumed a priori, extra-diagonal elements should be zero. In order to avoid suppression of signals from the RoI, solutions for $C_0$ or $C_{\rho 0}$ that result in a suppression of signals from the RoI should not be accepted.

Taking equation (4) as a starting point, different reference covariance matrices $D_\rho$ can be tested until a technically feasible covariance matrix $C_0$ is found. Systematic techniques for finding an excitation profile can make use of iterative methods, for example. Methods and devices for establishing an excitation profile in accordance with an exemplary embodiment are described in greater detail with reference to FIGS. 4-6.

Figure 4:
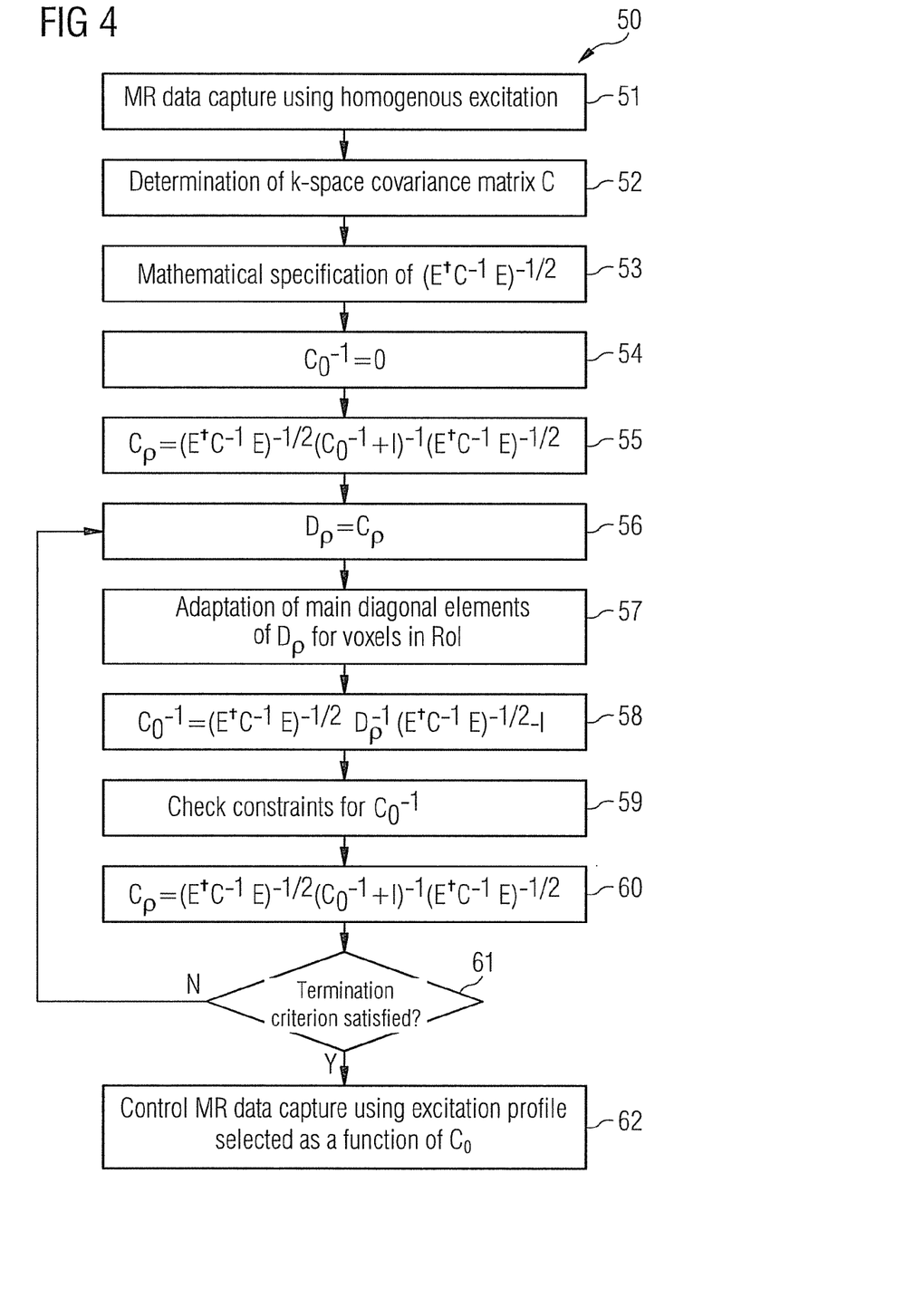
FIG. 4 is a flow diagram of a method according to an exemplary embodiment.

FIG. 4 is a flowchart illustration of a method 50 according to an exemplary embodiment. The method can be performed using the MR installation 1, wherein the computing facility 19 is configured for determining the excitation profile.

At 51, a first MR data capture is performed at the examination object at which an MR data capture will subsequently be performed with reduced noise in the RoI. The first MR data capture at 51 can be performed using homogeneous excitation. The excitation at 51 can be restricted to a layer of the examination object and is homogeneous in the sense that the amplitude of the HF pulse within the layer varies little or not at all. The first MR data capture can be performed in such a way that a smaller number of k-space points is sampled than during the subsequent MR data capture when a spatially variable excitation profile is used. In this way, it is possible to shorten the time that is required for the first MR data capture at 51, and the time that is required to mathematically establish the excitation profile.

At 52, the k-space covariance matrix C can be determined. The k-space covariance matrix C can be determined mathematically from the k-space points that were captured using the L receive coils.

The matrix $$(E^\dagger C^{-1} E)^{-\frac{1}{2}}$$

is mathematically determined at 53. For as long as the encoding matrix E and the k-space covariance matrix C do not change, the specified matrix $$(E^\dagger C^{-1} E)^{-\frac{1}{2}}$$

can continue to be used for the subsequent determination of a suitable excitation profile, without any need for recalculation of the matrix.

At 54, the inverse covariance matrix of the prior information, $C_0^{-1}$, is zeroed, and the assigned image space covariance matrix is calculated at 55. When determining $$C_\rho = (E^\dagger C^{-1} E)^{-1} \quad (20)$$

where $C_0^{-1} = 0$ at 54, it is taken into consideration that, for a homogeneous excitation, it is not known a priori in advance which voxels deliver no signal amplitude.

At 56, a reference covariance matrix in the image space $D_\rho$ is set to equal the matrix $C_\rho$ that was determined at 55.

At 57, main diagonal elements of the reference covariance matrix in the image space $D_\rho$ are changed, wherein said main diagonal elements correspond to voxels in the RoI. In particular, the main diagonal elements $D_\rho$ m,m for voxels m which are located in the RoI are reduced to a numerically lower value. Steps 55 and 56 result in the generation of a reference covariance matrix, which is derived from an actually determined image space covariance matrix $C_\rho$, such that the associated covariance matrix $C_0$ is likewise close to the constraints that are imposed by general technical conditions. The adaptation of the main diagonal elements of $D_\rho$ forces the noise in the image data for the RoI to decrease in comparison with a homogeneous excitation.

At 58, provision is made for calculating the covariance matrix $C_0$ of the prior information (or its inverse) which results in the reference covariance matrix in the image space, $D_\rho$, as determined at 56 and 57. The determination of the covariance matrix $C_0$ or the inverse matrix $C_0^{-1}$ can be done as per equation (1).

At 59, the covariance matrix $C_0$ or its inverse $C_0^{-1}$ can be modified such that it satisfies the constraints imposed upon it. For example, the inverse of the covariance matrix $C_0^{-1}$ can be modified such that it features no numerically high values in the main diagonal elements which correspond to the RoI. In this way, it is possible to ensure that the signal amplitude from the RoI is not suppressed. Alternatively or additionally, the extra-diagonal elements of $C_0^{-1}$ can be zeroed. It is thus possible to take into consideration that no correlations between voxels are assumed a priori.

Further constraints can optionally be imposed at 59. For example, if significant intensity fluctuations in the RoI are undesirable in the context of the subsequent MR data capture, a further constraint can be imposed such that the main diagonal elements of $C_0^{-1}$, which correspond to voxels of the RoI, must not vary significantly. A corresponding threshold value comparison can be used as appropriate.

A new image space covariance matrix $C_\rho$ is calculated at 60. The calculation can take place in accordance with equation (3), wherein use is now made of the non-zero inverse $C_0^{-1}$ of the matrix $C_0$, which was generated in steps 58 and 59.

At 61, a check determines whether a termination criterion is satisfied. According to an embodiment, this can be done by checking whether the image space covariance matrix $C_\rho$ determined at 60 satisfies a predefined condition, or whether the changes in the image space covariance matrix $C_\rho$ from iteration to iteration have become smaller than a threshold value.

The predefined condition, which is checked at 61 to establish whether it has been satisfied, can be e.g. that the sum of the diagonal elements of the image space covariance matrix $C_\rho$, after projection into the space corresponding to the voxels in the RoI, is smaller than a threshold value. In this case, the constraint can be imposed that the signal component from the RoI must not be suppressed. This condition can be expressed as $$Tr(RC_\rho R^\dagger) < SW \qquad (21)$$

When checking equation (21), a constraint can be applied such that the reduction in signal components from voxels outside of the RoI is desirable, but not a reduction of the signals from the RoI.

In this case, the matrix R is an $M_R \times M$ matrix in equation (2), wherein $M_R$ is the number of voxels in the RoI. The matrix entries in the matrix R are only 1 or 0 and select from the image space covariance matrix $C_\rho$ those entries which are assigned to a voxel of the RoI. The matrix R is defined such that $$RR^\dagger = I \qquad (22)$$

where I is an $M_R \times M_R$ unit matrix on the right-hand side of equation (22).

If it is determined at 61 that the termination criterion is not satisfied, the method returns to 56 for a further iteration.

If it is determined at 61 that the termination criterion is satisfied, an excitation profile is determined that corresponds to the most recently determined matrix $C_0$.

At 62, provision is then made for performing an MR data capture during which a spatially non-homogeneous excitation profile is generated. The excitation profile is selected such that the anticipated noise for voxels in the RoI is reduced, without thereby reducing the signal of the voxels of the RoI. This is achieved by a selection of the excitation profile according to the matrix $C_0$, which was determined in the iterative method.

Various pulse sequences can be used during the MR data capture at 62. The method for determining the excitation profile can advantageously be used at 62 for an MR data capture during which echo time-dependent variables are determined. An example of such a measurement is the creation of $T_2^*$ charts.

The MR data capture at 62, which takes place using the non-homogeneous excitation profile, can be performed in such a way that a higher resolution is achieved than in the first MR data capture at 51.

The termination criterion, which can be checked at step 61 in the method 50, is explained in greater detail below with reference to an exemplary embodiment. It is possible to use various terminal criteria which produce a reduction of the noise in the RoI by suppressing the signals of voxels outside of the RoI. In order to illustrate this more clearly, it is assumed in this case that in vectors and matrices in the image space, the first $M_R$ voxels correspond to the RoI. This assumption does not restrict the general applicability of the illustration, since it can always be achieved by means of a corresponding renumbering of the coordinates.

Assuming that the extra-diagonal elements of $C_0^{-1}$ are equal to 0, $$X = (C_0^{-1} + I)^{-1} = \begin{pmatrix} X1 & 0 \\ 0 & X2 \end{pmatrix}, \qquad (23)$$

where X1 is an $M_R \times M_R$ matrix and X2 is an $(M-M_R) \times (M-M_R)$ matrix. $M_R$ here still designates the number of voxels in the RoI. The matrices X1 and X2 are diagonal and feature positive matrix elements along the main diagonals. The matrix elements are located in the range from 0 to 1 inclusive in each case.

A block representation of the matrix $$F = (E^\dagger C^{-1} E)^{-\frac{1}{2}} = \begin{pmatrix} F11 & F21 \\ F12 & F22 \end{pmatrix} \qquad (24)$$

can be defined, where F11 is an $M_R \times M_R$ matrix, F21 is an $M_R \times (M-M_R)$ matrix, F12 is an $(M-M_R) \times M$ matrix and F22 is an $(M-M_R) \times (M-M_R)$ matrix.

A block representation of the selection matrix R $$R = (I\,0) \qquad (25)$$

can be defined, where I is an $M_R \times M_R$ unit matrix and 0 is an $M_R \times (M-M_R)$ zero matrix in equation (25).

Using the block representation, the matrix on the right-hand side of equation (21) can be represented as $$R(E^\dagger C^{-1} E)^{-\frac{1}{2}} (C_0^{-1} + I)^{-1} (E^\dagger C^{-1} E)^{-\frac{1}{2}} R^\dagger = \qquad (26)$$

$$(F11 \; F21) \begin{pmatrix} X1 & 0 \\ 0 & X2 \end{pmatrix} \begin{pmatrix} F11^\dagger \\ F21^\dagger \end{pmatrix} = F11 X1 F11^\dagger + F21 X2 F21^\dagger.$$

The trace of these variables is produced by $$Tr(F11 X1 F11^\dagger + F21 X2 F21^\dagger) = Tr(F11 X1 F11^\dagger) + Tr(F21 X2 F21^\dagger), \qquad (27)$$

where the first term on the right-hand side of equation (27) represents components of the noise in the RoI which are caused by voxels from the RoI, and the second term on the right-hand side of equation (27) represents components of the noise in the RoI which are caused by voxels outside of the RoI.

A reduction of the first term on the right-hand side of equation (27) is generally undesirable, since it would result in a reduction of the signal from the RoI. However, the second term on the right-hand side of equation (27) can be reduced in order to reduce the noise of the image data in the RoI.

The condition that the trace from equation (27) should be minimized without reducing the first term on the right-hand side of equation (27) can be expressed as $$\min Tr[F21 X2 F21^{\dagger}] = \min \sum_{m=1}^{M-MR} \sum_{n=1}^{M-MR} F21_{m,n} F21^*_{m,n} X2_{n,n} \qquad (28)$$

$$\min \sum_{n=1}^{M-MR} \kappa_n X2_{n,n},$$

where $$\kappa_n = \Sigma F21_{m,n} F21^*_{m,n}. \qquad (29)$$

The variable $\kappa_n$ represents a weighting for the component which the n-th voxel, which lies outside of the RoI, contributes to the noise in the image data in the RoI (calculated according to equation (21) here).

The variables $\kappa_n$ depend on the encoding matrix C and the k-space covariance matrix C in accordance with equation (24). In order to select a suitable excitation pattern, the variables $\kappa_n$ can therefore be calculated automatically after user definition of the RoI. The variables $\kappa_n$ can be output graphically, in order to allow the user to select a suitable excitation profile, wherein voxels can be suppressed depending on the $\kappa_n$ that is assigned to them. Alternatively, an excitation profile can be selected completely automatically as a function of the $\kappa_n$.

Although an iterative method for determining an excitation profile has been described with reference to FIG. 4, modifications of the method are possible. For example, different terminal criteria can be used. Depending on the application of the subsequent MR data capture, different constraints can be imposed on the matrix $C_0^{-1}$.

While an iterative method for determining an excitation profile can be used, a plurality of excitation profiles can be mathematically evaluated sequentially in the context of further exemplary embodiments. An evaluation of the influence that is exerted by an excitation profile on the resulting noise in image data can be done on the basis of equation (3).

Figure 5:
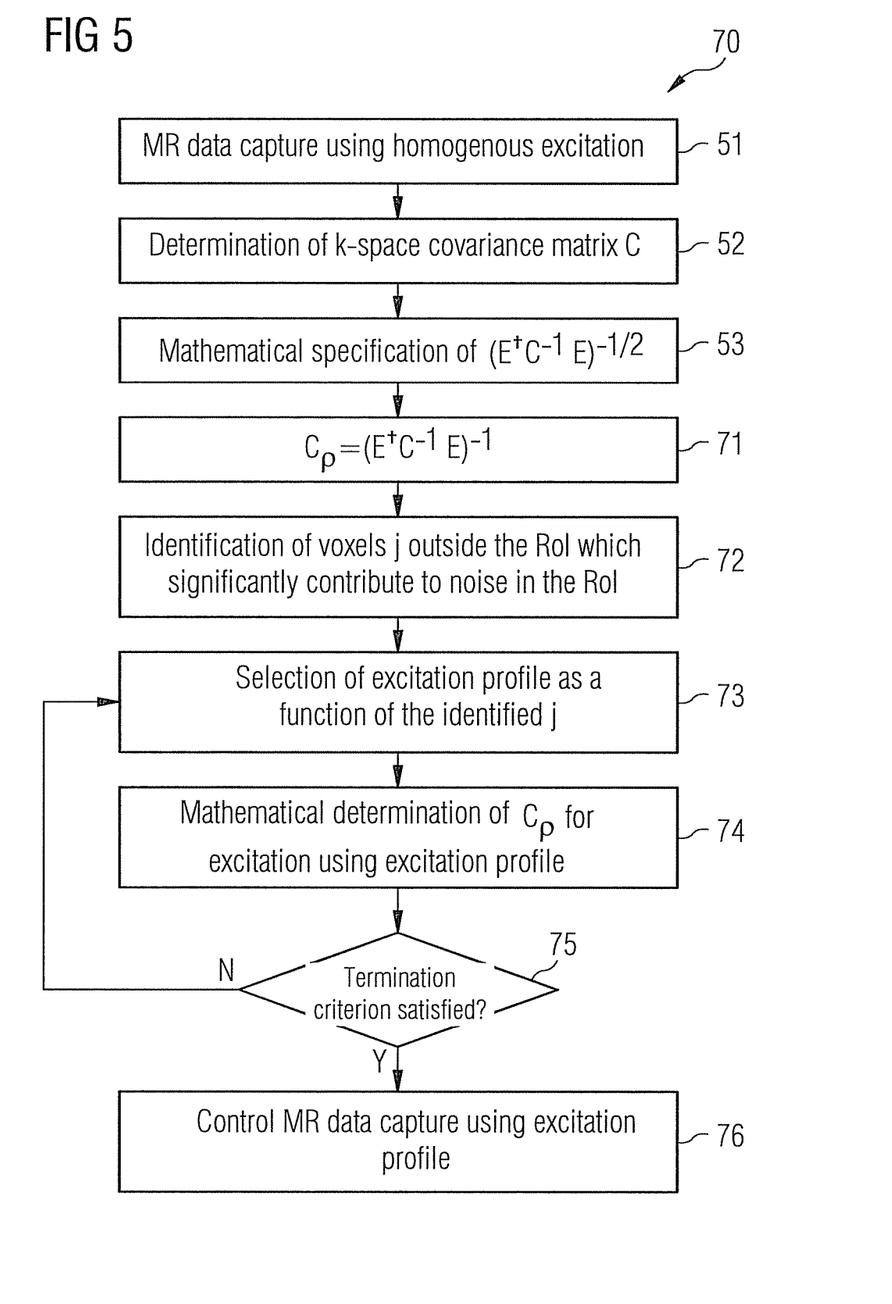
FIG. 5 is a flow diagram of a method according to a further exemplary embodiment.

FIG. 5 is a flowchart illustration of a method 70 according to an exemplary embodiment. The method can be performed using the MR installation 1, wherein the computing facility 19 is configured for determining the excitation profile.

The MR data capture at 51, the determination of the k-space covariance matrix C at 52 and the mathematical specification of the matrix $$(E^{\dagger} C^{-1} E)^{-\frac{1}{2}}$$

at 53 can be performed as in the case of the method 50 according to FIG. 4.

At 71, equation (20) is used to calculate an anticipated image space covariance matrix $C_\rho$ for homogeneous excitation.

At 72, the image space covariance matrix $C_\rho$ is used as a basis for determining voxels outside of the RoI which contribute significantly to the signal noise in the RoI. Such voxels can be determined in different ways. For example, it is possible to identify all of those voxels k outside of the RoI for which, for at least one voxel j within the RoI, the extra-diagonal element of the image space covariance matrix $C_\rho$ is greater than a threshold value SW1:

$$|C_{\rho k,j}| > SW1. \qquad (30)$$

According to a further embodiment, it is possible to identify all of those voxels outside of the RoI for which the weighting factor $\kappa_n$, which was defined in equation (29) and quantifies the contribution of the voxel n outside of the RoI to the noise of the image data in the RoI, is greater than a threshold value.

At 73, an excitation profile can be selected depending on the voxels outside of the RoI, as determined at 72. The excitation profile can be selected so as to suppress the amplitude of the excitation profile at those voxels outside of the RoI that were determined at 72. The excitation profile at 72 can be selected subject to various constraints. For example, a constraint could be stipulated whereby the amplitude of the excitation profile in the RoI must not feature any zeroes.

At 74, provision is made for mathematically determining the image space covariance matrix $C_\rho$ that would be produced for the excitation profile selected at 73. The mathematical determination of the image space covariance matrix $C_\rho$ can take place according to equation (3).

At 75, a check determines whether a termination criterion is satisfied. The check at 75 can be performed in the same way as step 61 of the method 50 as per FIG. 4. In particular, it is possible to check at 75 whether the contribution of voxels outside of the RoI to the signal noise of voxels within the RoI is less than a threshold value.

If it is determined at 75 that the termination criterion is not satisfied, the method returns to 73.

If it is determined at 75 that the termination criterion is satisfied, provision is made at 76 for performing an MR data capture during which the spatially non-homogeneous excitation profile is generated. The excitation profile is selected such that the anticipated signal noise for voxels in the RoI is reduced, without the signal component from the RoI itself being reduced. Various pulse sequences can be used during the MR data capture at 75. The method for determining the excitation profile can advantageously be used at 62 for an MR data capture during which echo time-dependent variables are determined. An example of such a measurement is the creation of $T_2^*$ charts.

According to the method in FIG. 5, the selection of the excitation profile is guided heuristically through the extra-diagonal elements of the image space covariance matrix $C_\rho$. These allow the determination of voxels outside of the RoI, which significantly increase the noise for voxels in the RoI. In the context of further exemplary embodiments, a group of possible excitation profiles can be mathematically evaluated, without beforehand identifying voxels which significantly increase the noise for voxels in the RoI. In this case, the evaluation can again include the mathematical determination of diagonal elements of the image space covariance matrix $C_\rho$.

The group of functions that are evaluated in respect of the resulting noise in image data of the RoI can be selected with reference to the arrangement of the excitation coils. For example, sinusoidally or cosinusoidally varying functions can be evaluated as a function of the location. In the k-space, those functions by means of which the excitation amplitude is modulated can be represented as a pair of excitations using the wave vectors and $\vec{k}_1$ and $\vec{k}_2 = -\vec{k}_1$. The group of excitation profiles to be tested can be further restricted by taking constraints into consideration. For example, the excitation profile should not have any zeroes within the RoI. A lower limit for $k_1$ is specified thus. Similarly, a lower limit for $k_1$ can follow from the constraint that the amplitude of the excitation profile over the RoI should have a relative change that is smaller than a threshold value. Additionally or alternatively, it can be a requirement that the modulation vectors and $\vec{k}_1$ and $\vec{k}_2 = -\vec{k}_1$ are parallel to the phase coding direction.

Figure 6:
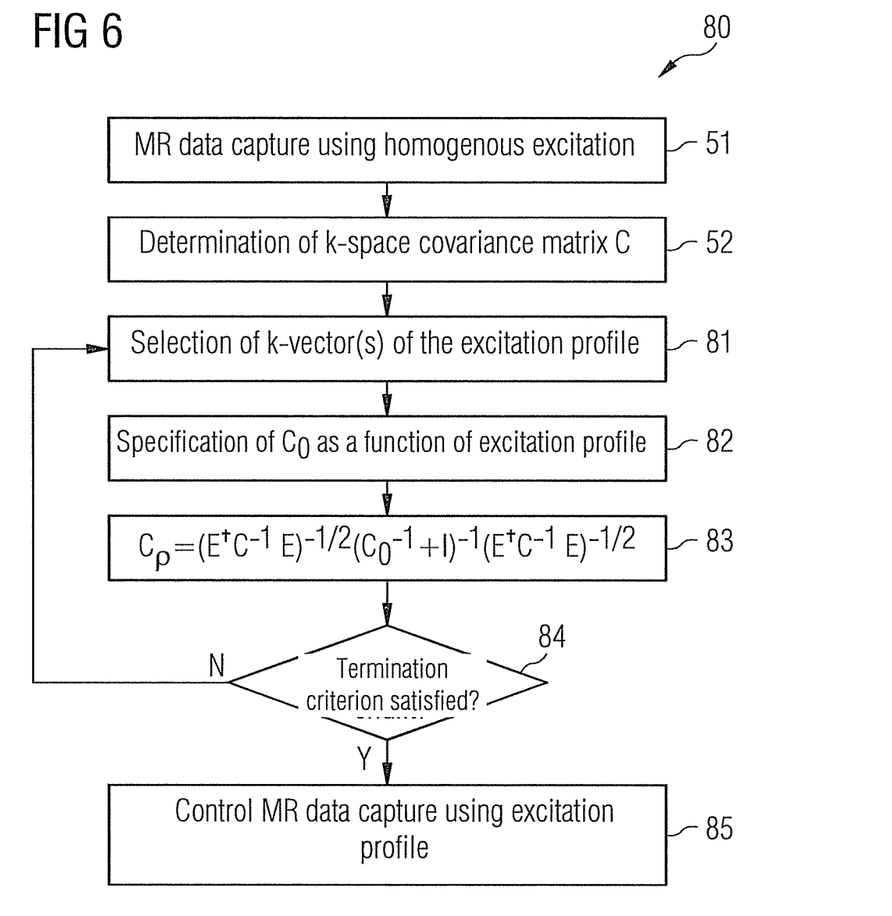
FIG. 6 is a flow diagram of a method according to a further exemplary embodiment.

FIG. 6 is a flowchart illustration of a method 80 according to an exemplary embodiment. The method can be performed using the MR installation 1, wherein the computing facility 19 is configured for determining the excitation profile.

The MR data capture at 51 and the determination of the k-space covariance matrix C at 52 can be performed as per the method 50 according to FIG. 4.

At 81, a modulation vector or a pair of modulation vectors which define the spatial sinusoidal or cosinusoidal modulation of the excitation profile are selected. The selection of the modulation vector or modulation vectors can be dependent on constraints. In this case, the selection of the modulation vector or modulation vectors can be such that the excitation profile has no zeroes within the RoI. The selection of the modulation vector or modulation vectors can be such that the amplitude of the excitation profile over the RoI has a relative change that is smaller than a threshold value. The selection of the modulation vector or modulation vectors can be such that the modulation vector or modulation vectors are parallel to the phase coding direction.

At 82, provision is made for determining the matrix $C_0$ or its inverse $C_0^{-1}$ which corresponds to the excitation profile that was selected at 81.

At 83, provision is made for mathematically determining the image space covariance matrix $C_\rho$ that would be produced for the excitation profile. The mathematical determination of the image space covariance matrix $C_\rho$ can take place according to equation (3).

At 84, a check determines whether a termination criterion is satisfied. The check at 84 can be performed in the same way as step 61 of the method 50 as per FIG. 4. In particular, it is possible to check at 84 whether the contribution of voxels outside of the RoI to the signal noise of voxels within the RoI is less than a threshold value.

If it is determined at 84 that the termination criterion is not satisfied, the method returns to 81.

If it is determined at 84 that the termination criterion is satisfied, provision is made at 85 for performing an MR data capture during which the spatially non-homogeneous excitation profile is generated. The excitation profile is sinusoidally or cosinusoidally modulated using the vector that was most recently selected at 81. The excitation profile is selected such that the anticipated signal noise for voxels in the RoI is reduced, without the signal component from the RoI itself being reduced. Various pulse sequences can be used during the MR data capture at 85. The method for determining the excitation profile can advantageously be used at 85 for an MR data capture during which echo time-dependent variables are determined.

Although methods and devices have been described in accordance with exemplary embodiments, modifications can be realized in the context of further exemplary embodiments.

In the context of further embodiments, for example, other groups of excitation profiles can be evaluated as sinusoidally or cosinusoidally modulated profiles with regard to the resulting noise of the image data. It is also possible in a first step to perform a heuristic determination of voxels that must be suppressed, as described with reference to FIG. 5, and then to utilize the information thus obtained for selecting a group of excitation profiles to be tested as per the method from FIG. 6 or as information for use in the context of the iterative method from FIG. 4.

Although the description relates to exemplary embodiments for establishing an excitation profile for subsequent use during the measurement of echo time-dependent variables, in further exemplary embodiments the methods and devices can also be configured for the purpose of determining an excitation profile for use in the context of other MR sequences.

The invention claimed is:

1. A method for establishing excitation parameters for a MR imaging captured by an MR device, comprising:
    parallel exciting the MR device using a plurality of transmit channels of the MR device;
    parallel capturing image data of an examination object using a plurality of receive channels of the MR device;
    determining elements of a k-space covariance matrix for a signal noise of the captured image data in a k-space;
    mathematically determining elements of an image space covariance matrix for a plurality of voxels in a region of interest of the examination object as a function of the k-space covariance matrix; and
    establishing the excitation parameters as a function of the elements of the image space covariance matrix,
    wherein an excitation profile is determined by minimizing an evaluation function that is dependent on diagonal elements of the image space covariance matrix corresponding to the plurality of voxels in the region of interest.

2. The method as claimed in claim 1, wherein the excitation parameters comprise information known prior to capturing the image data and are determined based on the elements of the image space covariance matrix that satisfy a predefined condition.

3. The method as claimed in claim 2, wherein a covariance of the prior information is determined based on geometry factors for the plurality of voxels in the region of interest that are reduced in comparison with a homogeneous excitation.

4. The method as claimed in claim 2, wherein a covariance matrix of the prior information is determined based on the elements of the image space covariance matrix that are reduced in comparison with a homogeneous excitation.

5. The method as claimed in claim 2, wherein a covariance matrix of the prior information is determined by an equation $$C_0^{-1} = (E^\dagger C^{-1} E)^{-\frac{1}{2}} D_\rho^{-1} (E^\dagger C^{-1} E)^{-\frac{1}{2}} - I,$$

where $C_0$ designates the covariance matrix of the prior information, E designates an encoding matrix, C designates the k-space covariance matrix, $D_\rho$ designates the image space covariance matrix, and I designates a unit matrix.

6. The method as claimed in claim 2, wherein a covariance of the prior information is determined iteratively.

7. The method as claimed in claim 2, wherein a covariance of the prior information is mathematically determined automatically subject to constraints.

8. The method as claimed in claim 1,
    wherein the elements of the image space covariance matrix are determined mathematically for a plurality of sets of excitation parameters and are assigned to a corresponding set of excitation parameters, and
    wherein the excitation parameters are established as a function of the elements of the image space covariance matrix each determined for the plurality of sets of excitation parameters.

9. The method as claimed in claim 8, wherein the plurality of sets of excitation parameters correspond to a plurality of excitation profiles.

10. The method as claimed in claim 1, wherein the evaluation function is represented by $$Tr(RC_\rho R^\dagger)$$

wherein Tr designates a trace operator, $C_\rho$ designates the image space covariance matrix, and R designates a projection operator for the region of interest, and wherein the minimization is subject to a constraint that signals from the region of interest are not reduced.

11. The method as claimed in claim 1, wherein the elements of the k-space covariance matrix are determined by a covariance of data in the k-space captured using different recording coils.

12. The method as claimed in claim 1, wherein the excitation parameters are determined for measuring variables that are dependent on an echo time.

13. The method as claimed in claim 1, wherein the excitation parameters are determined for a multi-echo imaging sequence.

14. The method as claimed in claim 1, wherein the excitation parameters are determined such that different portions of the captured image data are suppressed for different echo times.

15. A method for establishing excitation parameters for a MR imaging captured by an MR device, comprising:
    parallel exciting the MR device using a plurality of transmit channels of the MR device;
    parallel capturing image data of an examination object using a plurality of receive channels of the MR device;
    determining elements of a k-space covariance matrix for a signal noise of the captured image data in a k-space;
    mathematically determining elements of an image space covariance matrix for a plurality of voxels in a region of interest of the examination object as a function of the k-space covariance matrix; and
    establishing the excitation parameters as a function of the elements of the image space covariance matrix,
    wherein the elements of the image space covariance matrix are determined mathematically for a plurality of sets of excitation parameters and are assigned to a corresponding set of excitation parameters,
    wherein the excitation parameters are established as a function of the elements of the image space covariance matrix each determined for the plurality of sets of excitation parameters,
    wherein the plurality of sets of excitation parameters correspond to a plurality of excitation profiles, and
    wherein the plurality of excitation profiles are sinusoidally or cosinusoidally modulated as a function of a location.

16. A method for establishing excitation parameters for a MR imaging captured by an MR device, comprising:
    parallel exciting the MR device using a plurality of transmit channels of the MR device;
    parallel capturing image data of an examination object using a plurality of receive channels of the MR device;
    determining elements of a k-space covariance matrix for a signal noise of the captured image data in a k-space;
    mathematically determining elements of an image space covariance matrix for a plurality of voxels in a region of interest of the examination object as a function of the k-space covariance matrix; and
    establishing the excitation parameters as a function of the elements of the image space covariance matrix,
    wherein extra-diagonal elements of the image space covariance matrix are determined, and
    wherein specified voxels whose contribution to the signal noise for the plurality of voxels in the region of interest exceeds a threshold value are determined based on the extra-diagonal elements.

17. A device for establishing excitation parameters for a MR imaging captured by an MR device, comprising:
    an interface for receiving k-space data of an examination object that is parallel captured using a plurality of receive channels of the MR device, wherein the MR device is parallel excited by a plurality of transmit channels of the MR device; and
    an electronic computing device that is configured to:
        determine elements of a k-space covariance matrix for a signal noise in the k-space data,
        mathematically determine elements of an image space covariance matrix for a plurality of voxels of a region of interest of the examination object as a function of the k-space covariance matrix, and
        automatically establish the excitation parameters as a function of the elements of the image space covariance matrix,
    wherein an excitation profile is determined by minimizing an evaluation function that is dependent on diagonal elements of the image space covariance matrix corresponding to the plurality of voxels in the region of interest.

18. A magnetic resonance device, comprising
    an excitation device comprising a plurality of transmit channels;
    a receive entity comprising a plurality of receive channels for capturing image data of an examination object following excitation of the excitation device; and
    a device coupled to the excitation device for controlling the excitation device based on excitation parameters,
    wherein the device comprises:
        an interface for receiving k-space data of the examination object that is parallel captured using the plurality of receive channels, wherein the MR device is parallel excited by the plurality of transmit channels; and
        an electronic computing device that is configured to:
            determine elements of a k-space covariance matrix for a signal noise in the k-space data,
            mathematically determine elements of an image space covariance matrix for a plurality of voxels of a region of interest of the examination object as a function of the k-space covariance matrix, and
            automatically establish the excitation parameters as a function of the elements of the image space covariance matrix,
    wherein an excitation profile is determined by minimizing an evaluation function that is dependent on diagonal elements of the image space covariance matrix corresponding to the plurality of voxels in the region of interest.

* * * * *